(12) United States Patent
Yang

(10) Patent No.: US 11,018,118 B2
(45) Date of Patent: May 25, 2021

(54) BACKLIGHT DEVICE AND MANUFACTURING METHOD THEREOF

(71) Applicant: Wuhan China Star Optoelectronics Technology Co., Ltd., Wuhan (CN)

(72) Inventor: Yong Yang, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 67 days.

(21) Appl. No.: 16/476,568

(22) PCT Filed: Nov. 23, 2018

(86) PCT No.: PCT/CN2018/117233
§ 371 (c)(1),
(2) Date: Jul. 9, 2019

(87) PCT Pub. No.: WO2020/062522
PCT Pub. Date: Apr. 2, 2020

(65) Prior Publication Data
US 2020/0203320 A1 Jun. 25, 2020

(30) Foreign Application Priority Data
Sep. 30, 2018 (CN) .......................... 201811155955.9

(51) Int. Cl.
*H01L 25/075* (2006.01)
*H01L 33/58* (2010.01)
*H01L 33/62* (2010.01)
*G02F 1/13357* (2006.01)

(52) U.S. Cl.
CPC .... *H01L 25/0753* (2013.01); *G02F 1/133603* (2013.01); *G02F 1/133605* (2013.01); *G02F 1/133606* (2013.01); *G02F 1/133611* (2013.01); *H01L 33/58* (2013.01); *H01L 33/62* (2013.01);
(Continued)

(58) Field of Classification Search
CPC ............. H01L 33/50–508; H01L 33/58; H01L 25/075–20753; H01L 2933/0058; G02F 1/133603; G02F 1/133605; G02F 1/133606; G02F 1/133611
See application file for complete search history.

(56) References Cited

U.S. PATENT DOCUMENTS

| | | | |
|---|---|---|---|
| 2002/0055200 A1* | 5/2002 | Kondo | G02B 6/43 438/106 |
| 2014/0185299 A1* | 7/2014 | Sanga | G02B 5/285 362/293 |
| 2017/0133357 A1* | 5/2017 | Kuo | H01L 25/0753 |

(Continued)

FOREIGN PATENT DOCUMENTS

| | | | | |
|---|---|---|---|---|
| CN | 111146231 A | * | 5/2020 | ............. H01L 33/08 |
| JP | 2014165062 A | * | 9/2014 | |
| WO | WO-2012121372 A1 | * | 9/2012 | ....... G02F 1/133617 |

OTHER PUBLICATIONS

US 10,854,670 B2, 12/2020, Chae (withdrawn)*

*Primary Examiner* — Mariceli Santiago

(57) ABSTRACT

A backlight device and a manufacturing method thereof are provided. The backlight device includes a substrate, a Light-Emitting Diode (LED) layer and a band-pass filter. The LED layer is disposed on the substrate and includes a plurality of LED chips arranged at intervals. The band-pass filter is disposed on the LED layer and is provided with openings formed at positions corresponding to the LED chips.

20 Claims, 5 Drawing Sheets

(52) U.S. Cl.
CPC ............. *H01L 2933/0058* (2013.01); *H01L 2933/0066* (2013.01)

(56) References Cited

U.S. PATENT DOCUMENTS

2018/0275450 A1* 9/2018 Sato .................. G02F 1/133603
2019/0214373 A1* 7/2019 Kim ....................... H01L 33/42
2020/0075664 A1* 3/2020 Azize .................... H01L 33/504

* cited by examiner

BACKLIGHT DEVICE AND MANUFACTURING METHOD THEREOF

RELATED APPLICATIONS

This application is a National Phase of PCT Patent Application No. PCT/CN2018/117233 having International filing date of Nov. 23, 2018, which claims the benefit of priority of Chinese Patent Application No. 201811155955.9 filed on Sep. 30, 2018. The contents of the above applications are all incorporated by reference as if fully set forth herein in their entirety.

FIELD AND BACKGROUND OF THE INVENTION

The present application relates to the technical field of display, and in particular to a backlight device and a manufacturing method thereof.

As a strong competitor for the OLED display technology in the future market, mini Light-Emitting Diodes (LEDs) are LEDs in size between conventional LEDs and micro LEDs. Since the mini LEDs are high in brightness, can be fabricated on a flexible substrate, can be applied to the high dynamic contrast display technology, the narrow bezel display technology and the special-shaped display technology and the like, the mini LEDs have become a hot topic in market research. However, mini LEDs are still inferior to the conventional backlight products and the OLED display technology in terms of luminous efficiency, uniformity of light mixture, cost and the like. For example, in a direct backlight architecture in which a mini LED is fabricated on a printed circuit board or a flexible circuit board, due to the difference in refractivity, part of light from a surface light source is restricted between the films and the substrate and thus cannot be emitted; moreover, multiple times of refraction of light between films result in the loss of light energy and the reduction in luminous efficiency. For a film, the transmittance of light is also somewhat limited. How to improve the luminous efficiency of LED chips and reduce the loss of light inside the surface light source has become a primary issue in the improvement of the luminous efficiency of the surface light source.

Therefore, it is necessary to provide a backlight device and a manufacturing method thereof to solve the problems in the prior art.

SUMMARY OF THE INVENTION

In view of the defects in the prior art, a main objective of the present invention is to provide a backlight device and a manufacturing method thereof, which can reduce the internal light echo loss and improve the overall luminous efficiency of a surface light source.

For this purpose, the present invention provides a backlight device, including: a substrate; a Light-Emitting Diode (LED) layer, which is disposed on the substrate and comprises a plurality of LED chips arranged at intervals; and, a band-pass filter which is disposed on the LED layer, wherein openings are formed on the band-pass filter at positions corresponding to the LED chips.

In one embodiment of the present disclosure, the backlight device further comprises at least one diffusion layer disposed on the band-pass filter and receives light emitted from the LED layer through the openings on the band-pass filter so that the light is dispersed uniformly.

In one embodiment of the present disclosure, the LED chips comprise red, green and blue LED chips.

In one embodiment of the present disclosure, the substrate at least comprises a metal wire layer and an insulating layer.

In one embodiment of the present disclosure, the backlight device further comprises at least one brightness enhancement film which is disposed on the at least one diffusion layer.

In one embodiment of the present disclosure, the LED chips are mini LED chips each having a size of 100 μm to 200 μm.

In one embodiment of the present disclosure, the LED layer is coated with a transparent filling layer, and the transparent filling layer is filled in gaps between the LED chips arranged at intervals and has the same height as the LED chips.

In one embodiment of the present disclosure, the band-pass filter is prepared on a high-temperature-resistant transparent plastic plate.

The present disclosure further provides a method for manufacturing the aforementioned backlight device. The method comprises the following steps of: providing a substrate; providing a Light-Emitting Diode (LED) layer on the substrate, the LED layer comprising a plurality of LED chips arranged at intervals; and providing a band-pass filter on the LED layer, wherein openings are formed on the band-pass filter at positions corresponding to the LED chips.

In one embodiment of the present disclosure, the method for manufacturing a backlight device further comprises steps of: forming at least one diffusion layer on the band-pass filter; and forming at least one brightness enhancement film on the at least one diffusion layer.

In the present invention, by additionally providing a band-pass filter above the LED layer, the internal light echo loss of the mini LED device is reduced, and the overall luminous efficiency of a surface light source is improved.

DESCRIPTION OF SPECIFIC EMBODIMENTS OF THE INVENTION

To make the objectives, features and advantages of the present invention more apparent and comprehensible, preferred embodiments of the present invention will be listed and described in detail hereinafter with reference to the accompanying drawings. Besides, the directional terms as used here, such as "upper", "lower", "front", "rear", "left", "right", "inner", "outer" and "side", merely refer to the directions shown in the accompanying drawings. Therefore, the directional terms are used for describing and understanding the present invention, rather than limiting the present invention.

Figure 1:
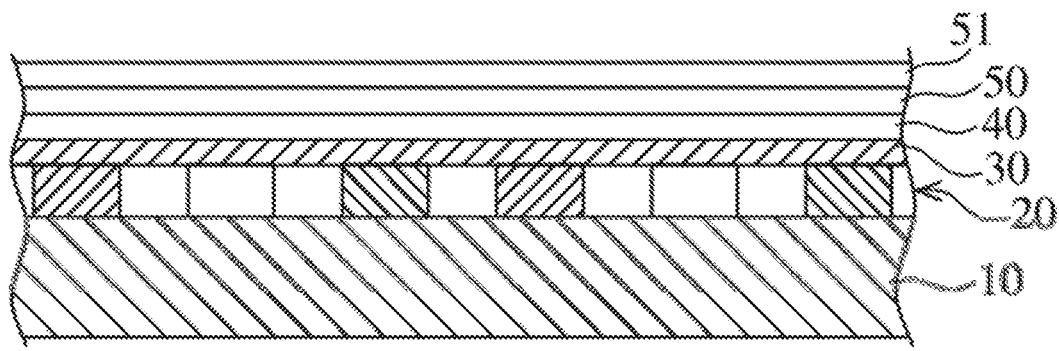
FIG. 1 is a sectional view of a backlight device according to an embodiment of the present invention.

The backlight device of the present invention may be mainly used as a backlight source for a general flat display screen. Referring to FIG. 1, FIG. 1 is a sectional view of a backlight device according to an embodiment of the present invention. The backlight device mainly includes a substrate 10, an LED layer 20 and a band-pass filter 30, and may further include at least one diffusion layer 40 and at least one brightness enhancement film 50.

In an embodiment, the substrate 10 at least includes a metal wire layer and an insulating layer. For example, the substrate 10 may include a copper wire layer, a polyimide film layer and a silkscreen layer, wherein the silkscreen layer is used for secondarily reflecting blue light transmitting through the band-pass filter to the at least one diffusion layer.

Figure 2A:
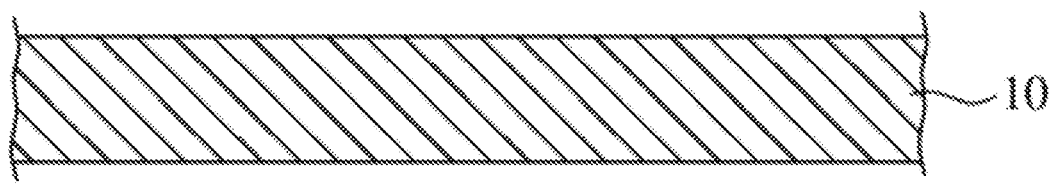
FIGS. 2A, 2B, 2C and 2D are schematic flowcharts of manufacturing the backlight device of FIG. 1.
Figure 2B:
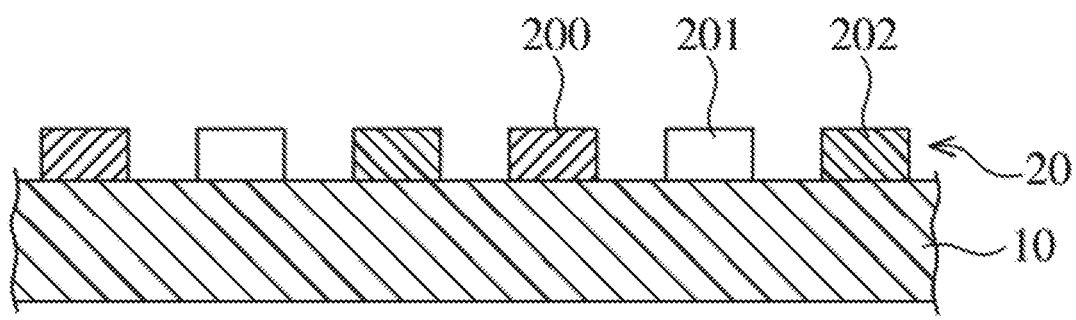
Figure 2C:
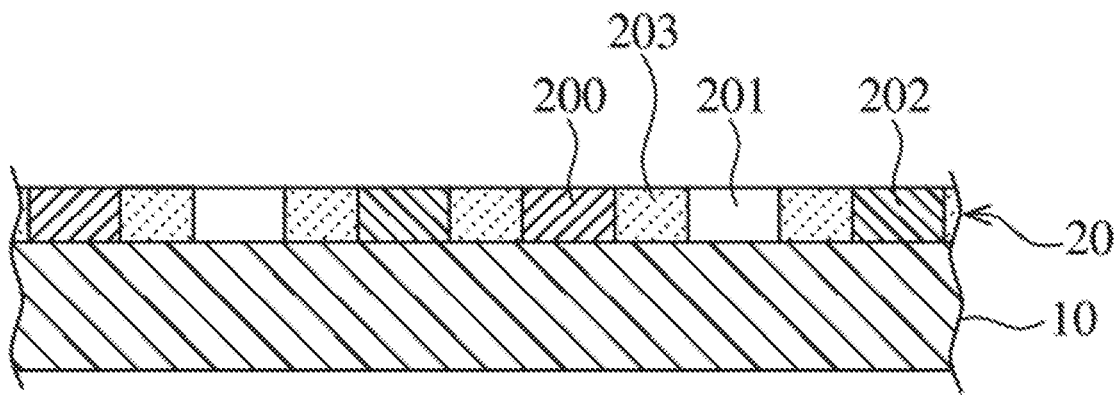

As shown in FIG. 1 and with reference to FIGS. 2B and 2C, the LED layer 20 is disposed on the substrate 10 and includes a plurality of LED chips (200, 201, 202) arranged at intervals. Specifically, the LED chips (200, 201, 202) may include red, green and blue mini LED chips each having a size of 100 μm to 200 μm. Since the LED layer 20 provides red, green and blue light by the red, green and blue mini LED chips, respectively, the LED layer 20 may not have a fluorescent powder layer or a quantum dot film layer, and it is not required to irradiate and excite the fluorescent powder layer or the quantum dot film layer to convert light into light in other colors by the blue mini LED chips. Accordingly, the loss of photons during the excitation of the fluorescent powder layer or the quantum dot film layer is avoided, and the overall luminous efficiency of the surface light source is improved.

In an embodiment, the LED layer 20 is further coated with a transparent filling layer 203, and the transparent filling layer 203 is filled in gaps between the LED chips (200, 201, 202) arranged at intervals and has the same height as the LED chips (200, 201, 202). In this way, the surface flatness of the LED layer 20 may be ensured, and it is advantageous for the arrangement of the subsequent film layers.

As shown in FIG. 1, the band-pass filter 30 is disposed on the LED layer 20. The band-pass filter 30 is preferably prepared on a high-temperature-resistant transparent plastic plate. A plurality of openings are formed on the band-pass filter 30 at positions corresponding to the LED chips (200, 201, 202), and the surface of the band-pass filter 30 allows blue light to transmit therethrough but reflects red light and green light.

As shown in FIG. 1, the at least one diffusion layer 40 is disposed on the band-pass filter 30, and receives light emitted from the LED layer 20 through the openings on the band-pass filter 30 so that the light is dispersed uniformly. Since the light is dispersed uniformly, the at least one diffusion layer 40 will reflect part of the received light to the band-pass filter 30. At this time, the surface of the band-pass filter 30 allows blue light in the light reflected by the at least diffusion layer 40 to transmit therethrough, and reflects red light and green light in the reflected light to the at least one diffusion layer 40.

As shown in FIG. 1, the at least one brightness enhancement film 50 is disposed on the at least one diffusion layer 40. In this embodiment, the backlight device includes upper and lower brightness enhancement films (50, 51) to gather light in a certain angle range so as to increase the brightness on the front side of the surface light source.

Since the light emitted from the red, green and blue LED chips directly enters the lower surface of the diffusion layer 40 without passing through the band-pass filter 30, part of the right in the three colors (i.e., red, green and blue light) is reflected by the lower surface of the diffusion later 40; the reflected blue light is secondarily reflected by the band-pass filter 30 and the silkscreen layer on the substrate 10 and then enters the diffusion layer 40 again; and, the green light and the red light are almost completely reflected to the diffusion layer 40 by the surface of the band-pass filter 30 and will not transmit through the band-pass filter 30 to enter the silkscreen layer on the substrate 10. By such an optical path design, more light may be allowed to enter the diffusion layer 40 and the light enhancement film layer 50, so that the overall luminous efficiency of the surface light source is improved. Meanwhile, by LED chips in three primary colors, the loss of excitation light efficiency caused by the excitation of the fluorescent powder layer or the quantum dot film layer by the blue LED chips may be avoided, and more efficient luminescence may be realized.

Figure 4:
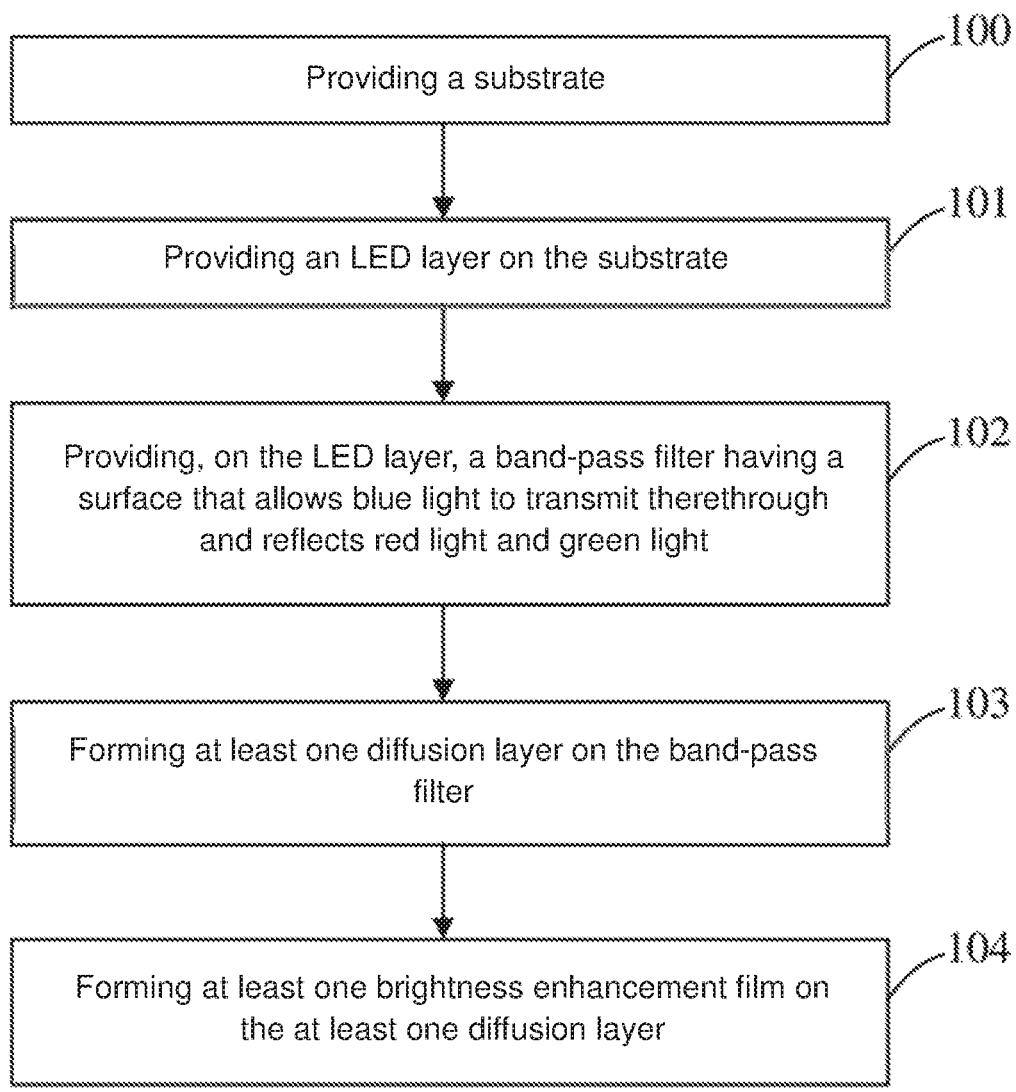
FIG. 4 is a flowchart of a method for manufacturing a backlight device according to an embodiment of the present invention.

Further referring to FIGS. 2A-2D and FIG. 4, FIGS. 2A-2D are schematic flowcharts of manufacturing the backlight device of FIG. 1, and FIG. 4 is a flowchart of a method for manufacturing a backlight device according to an embodiment of the present invention. The method for manufacturing a backlight device mainly includes the following steps S100 to S102.

Step S100: A substrate 10 is provided, as shown in FIG. 2A, wherein the substrate 10 may be manufactured from at least one metal wire layer and an insulating layer, and the metal wire layer and the insulating layer may include, for example, a copper wire layer, a polyimide film layer and a silkscreen layer.

Step S101: An LED layer 20 is provided on the substrate 10, as shown in FIG. 2B, wherein the LED layer 20 includes a plurality of LED chips (200, 201, 202) arranged at intervals. Specifically, the LED chips (200, 201, 202) may include red, green and blue mini LED chips each having a size of 100 μm to 200 μm. This step may further include a step of forming a transparent filling layer 203 by a coating process. The transparent filling layer 203 is filled in gaps between the LED chips (200, 201, 202) arranged at intervals, as shown in FIG. 2C.

Figure 2D:
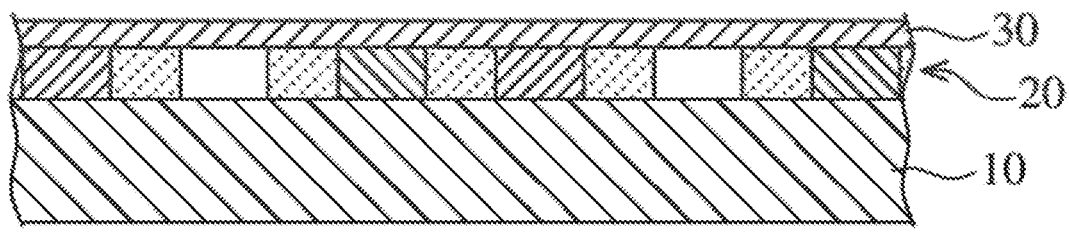
Figure 3:
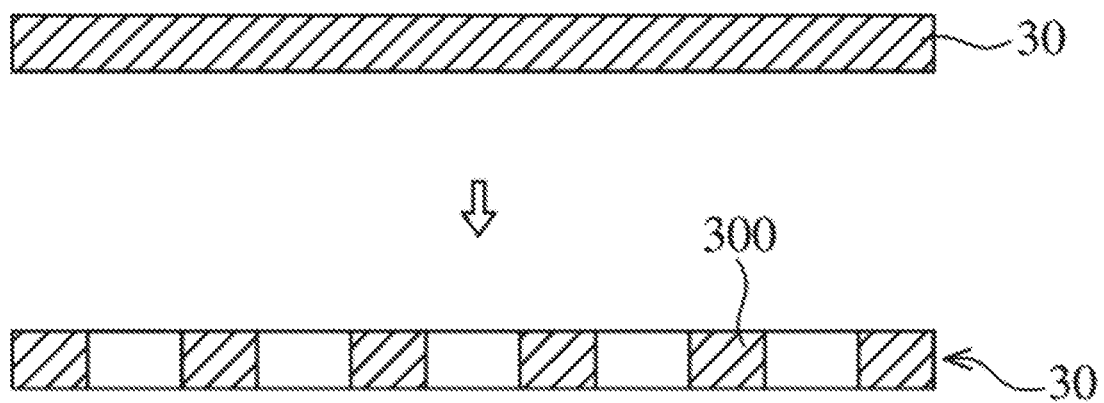
FIG. 3 is a schematic flowchart of manufacturing a band-pass filter in the backlight device according to an embodiment of the present invention.

Step S102: A band-pass filter 30 having a surface that allows blue light to transmit therethrough and reflects red light and green light is provided on the LED layer 20, as shown in FIG. 2D. With reference to FIG. 3, in this step, the band-pass filter 30 is first prepared on a high-temperature-resistant transparent plastic plate, openings 300 are then formed at positions corresponding to the LED chips (200, 201, 202), and the band-pass filter 30 is arranged on the LED layer 20 by hot pressing.

The method for manufacturing a backlight device may further include the following steps S103 to S104.

Step S103: At least one diffusion layer 40 is formed on the band-pass filter 30, wherein the diffusion layer 40 is a resin layer or an adhesive containing scattering particles and is used for receiving light emitted from the LED layer 20 through the openings on the band-pass filter 30 so that the light is dispersed uniformly.

Step S104: At least one brightness enhancement film 50 is formed on the at least one diffusion layer 40.

In conclusion, compared with the prior art, in the present invention, by additionally providing, above the LED layer, a band-pass filter for allowing blue light to transmit therethrough and reflecting red light and green light, the internal light echo loss of the mini LED device is reduced, and the overall luminous efficiency of the surface light source is improved. Meanwhile, in the present invention, by manufacturing the mini LED device by red, green and blue LED chips, the excitation loss of photons caused by the excitation of fluorescent powder or a quantum dot film to emit light in other colors by blue LED chips is avoided, and the luminous efficiency of the mini LED device is improved.

The present invention has been described above by the related embodiments, but these embodiments are merely examples for implementing the present invention. It is to be noted that the disclosed embodiments are not intended to limit the scope of the present invention. Rather, the modifications and equivalent arrangements without departing from the spirit and scope of the appended claims shall fall into the scope of the present invention.

What is claimed is:

1. A backlight device, comprising:
   a substrate;
   a Light-Emitting Diode light-emitting diode (LED) layer disposed on the substrate and comprising a plurality of LED chips arranged at intervals;
   a band-pass filter disposed on the LED layer, wherein the band-pass filter is provided with a plurality of openings that are formed at positions corresponding to the LED chips, and the band-pass filter allows blue light to transmit therethrough; and
   at least one diffusion layer disposed on the band-pass filter and receives light emitted from the LED layer through the openings on the band-pass filter.

2. The backlight device according to claim 1, wherein the LED chips are mini LED chips each having a size of 100 μm to 200 μm, and the LED chips comprise red, green and blue LED chips.

3. The backlight device according to claim 1, wherein the substrate at least comprises a metal wire layer and an insulating layer.

4. The backlight device according to claim 1, wherein the backlight device further comprises at least one brightness enhancement film which is disposed on the at least one diffusion layer.

5. The backlight device according to claim 1, wherein the LED layer is coated with a transparent filling layer, and the transparent filling layer is filled in gaps between the LED chips arranged at intervals and has the same height as the LED chips.

6. A backlight device, comprising:
   a substrate;
   a Light-Emitting Diode light-emitting diode (LED) layer disposed on the substrate and comprising a plurality of LED chips arranged at intervals; and
   a band-pass filter disposed on the LED layer, wherein the band-pass filter is provided with a plurality of openings that are formed at positions corresponding to the LED chips.

7. The backlight device according to claim 6, wherein the backlight device further comprises at least one diffusion layer disposed on the band-pass filter and receives light emitted from the LED layer through the openings on the band-pass filter so that the light is dispersed uniformly.

8. The backlight device according to claim 7, wherein the LED chips comprise red, green and blue LED chips.

9. The backlight device according to claim 8, wherein the substrate at least comprises a metal wire layer and an insulating layer.

10. The backlight device according to claim 6, wherein the LED device further comprises at least one brightness enhancement film which is disposed on the at least one diffusion layer.

11. The backlight device according to claim 8, wherein the LED chips are mini LED chips each having a size of 100 μm to 200 μm.

12. The backlight device according to claim 6, wherein the LED layer is coated with a transparent filling layer, and the transparent filling layer is filled in gaps between the LED chips arranged at intervals and has the same height as the LED chips.

13. The backlight device according to claim 6, wherein the band-pass filter is prepared on a high-temperature-resistant transparent plastic plate.

14. A method for manufacturing a backlight device, comprising the following steps of:
   providing a substrate;
   providing a Light-Emitting Diode light-emitting diode (LED) layer on the substrate, the LED layer comprising a plurality of LED chips arranged at intervals; and
   providing a band-pass filter on the LED layer, wherein a plurality of openings are formed on the band-pass filter at positions corresponding to the LED chips.

15. The method for manufacturing a backlight device according to claim 14, further comprising the following steps of:
   forming at least one diffusion layer on the band-pass filter; and
   forming at least one brightness enhancement film on the at least one diffusion layer.

16. The method for manufacturing a backlight device according to claim 14, wherein the LED chips comprise red, green and blue LED chips.

17. The method for manufacturing a backlight device according to claim 14, wherein the substrate at least comprises a metal wire layer and an insulating layer.

18. The method for manufacturing a backlight device according to claim 14, wherein the LED chips are mini LED chips each having a size of 100 μm to 200 μm.

19. The method for manufacturing a backlight device according to claim 14, wherein the LED layer is coated with a transparent filling layer, and the transparent filling layer is filled in gaps between the LED chips arranged at intervals and has the same height as the LED chips.

20. The method for manufacturing a backlight device according to claim 14, wherein the band-pass filter is prepared on a high-temperature-resistant transparent plastic plate.

\* \* \* \* \*